US007065701B2

(12) United States Patent
Kim et al.

(10) Patent No.: US 7,065,701 B2
(45) Date of Patent: Jun. 20, 2006

(54) METHOD FOR ITERATIVELY DECODING BLOCK TURBO CODES AND RECORDING MEDIUM FOR STORING ITERATIVE DECODING PROGRAM OF BLOCK TURBO CODES

(75) Inventors: Sooyoung Kim, Daejeon (KR); Woo-Seok Yang, Daejeon (KR); Ho-Jin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 342 days.

(21) Appl. No.: 10/273,256

(22) Filed: Oct. 18, 2002

(65) Prior Publication Data

US 2003/0110437 A1 Jun. 12, 2003

(30) Foreign Application Priority Data

Dec. 8, 2001 (KR) .............................. 2001-77598

(51) Int. Cl.
*H03M 13/03* (2006.01)
(52) U.S. Cl. ....................................... 714/795; 714/794
(58) Field of Classification Search ................ 714/795, 714/794
See application file for complete search history.

(56) References Cited

U.S. PATENT DOCUMENTS

| 5,181,209 A | 1/1993 | Hagenauer et al. |
| 5,446,747 A | 8/1995 | Berrou |
| 5,563,897 A | 10/1996 | Pyndiah et al. |

FOREIGN PATENT DOCUMENTS

KR 2001-19469 3/2001

OTHER PUBLICATIONS

Stirling-Gallacher, R.A.; Performance of sub-optimal normalisation schemes for a turbo decoder using the soft output Viterbi algorithm; The 11th IEEE International Symposium on Personal, Indoor and Mobile Radio Communications, Sep. 18-21, 2000, pp.: 888-.*

Hagenauer, J.; Papke, L.; Decoding "turbo"-codes with the soft output Viterbi algorithm (SOVA), Proceedings IEEE International Symposium on Information Theory, Jun. 27-Jul. 1, 1994 pp.: 164.*

Hagenauer, J.; Offer, E.; Papke, L.; Iterative decoding of binary block and convolutional codes, IEEE Transactions on Information Theory, vol. 42, Issue 2, Mar. 1996 pp. 429-445.*

* cited by examiner

*Primary Examiner*—Joseph D. Torres
(74) *Attorney, Agent, or Firm*—Mayer, Brown, Rowe & Maw LLP

(57) ABSTRACT

A method for iteratively decoding a block turbo code includes: receiving a signal frame formed of a product code obtained by serially concatenating block codes; forming a reliability array for signal demodulation and initializing extrinsic reliability information; performing a complexity-reduced soft decision output Viterbi decoding algorithm for all of the codewords existing on a current axis and calculating extrinsic reliability using soft decision output information output as a result of the decoding; checking whether an iterative decoding completion condition is satisfied, and outputting a decoded value and terminating an iterative decoding process when the condition is satisfied; and normalizing reliability information when the condition is not satisfied, performing reliability equalization, and repeating the decoding process for a next axis.

12 Claims, 7 Drawing Sheets

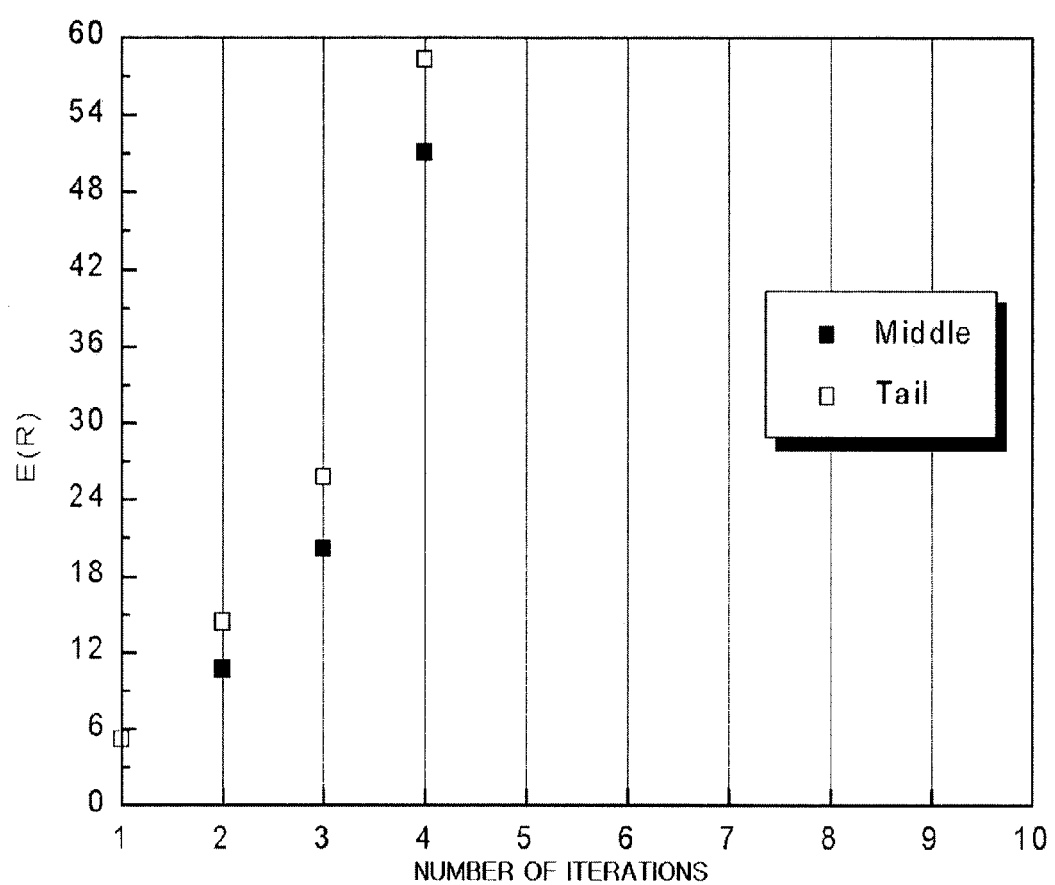

METHOD FOR ITERATIVELY DECODING BLOCK TURBO CODES AND RECORDING MEDIUM FOR STORING ITERATIVE DECODING PROGRAM OF BLOCK TURBO CODES

CROSS REFERENCE TO RELATED APPLICATION

This application is based on Korea Patent Application No. 2001-77598 filed on Dec. 8, 2001 in the Korean Intellectual Property Office, the content of which is incorporated herein by reference.

BACKGROUND OF THE INVENTION (a) Field of the Invention

The present invention relates to a method for iteratively decoding a block turbo code and a recording medium for storing an iterative decoding program of a block turbo code. More specifically, the present invention relates to a method for iteratively decoding a block turbo code and a recording medium for storing an iterative decoding program of a block turbo code, which are capable of reducing complexity and realizing iterative decoding without serious performance degradation when iterative decoding is performed using a soft decision output Viterbi decoding method for a product code obtained by serially concatenating systematic block codes.

(b) Description of the Related Art

An iterative decoding method using a soft decision output for a product code of a block code is referred to as a block turbo code. Contents related to the block turbo code are disclosed in U.S. Pat. No. 5,563,897.

According to the aforementioned patent, an algebraic decoding method is used in order to calculate the soft decision output. Such a decoding scheme has to refer to the decoder several times, so additional work is required to estimate the soft decision output.

A method for iteratively decoding block codes using a soft output Viterbi algorithm (SOVA) with a complexity-reduction technique is disclosed in Korean Patent Publication No. 2001-019469.

The operational principle of the decoding method of the above patent is as follows.

First, at an arbitrary r-th point of time of a trellis for an (n,k) block code, information on all paths is calculated and recorded.

Second, a surviving path is selected in each node.

Third, reliability, which is a metric difference value between the surviving path and a contending path is stored, that is, a soft decision output value is stored.

Fourth, the reliability values stored in a path from the point of time 0 to (r−1) are compared with the reliability value of the current contending path. The reliability value is updated according to the following rules.

When we denote the metric difference value between the surviving path and the contending path merging to the m-th state at the r-th point of time in the trellis as $\Delta_r^m$, an information bit calculated in the surviving path as $u_j^s$, and an information bit calculated in the contending path as $u_j^c$, If $u_j^s \neq u_j^c$, $L_j^s = \min(L_j^s, \Delta_r^m)$, and If $u_j^s = u_j^c$, $L_j^s = \min(L_j^s, \Delta_r^m + L_j^c)$.

Fifth, the above work is repeated to the last point of time (an (n−1)-th point of time) of the trellis.

Sixth, the soft decision output for the decoded-word is the reliability value corresponding to the codeword, with polarity added.

A complexity-reducing technique is applied to the above SOVA according to the following principle.

There are a number of paths in the code trellis. Generally, the number of paths at a time point increases as the error correction capability of a code becomes greater. If the number of paths at a time point is comparatively large, the probability distribution of the path metric value follows the Gaussian distribution according to the central limit theorem.

This implies that we can easily know the A-th best path metric out of total S paths if we know the mean and the variance of the path metrics. This is because we know the probability distribution of the path metric follows the Gaussian distribution.

Therefore, the path metrics of the A paths are larger than a reference path metric $(Pm_{ri})$ at the i-th time point. $Pm_{ri}$ may be obtained by Equation 1.

$$\frac{A}{S_i} = \begin{cases} \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx \\ \text{if } A/S_i > 0.5 \\ 1 - \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx \\ \text{if } A/S_i < 0.5 \end{cases} \quad \text{[EQUATION 1]}$$

wherein A is the number of paths to be sustained at each level (time point), $S_i$ is the number of total existing paths at the i-th level, $m_{pmi}$ is the mean of the path metrics at the i-th level, and $\sigma_{pmi}$ is the standard deviation of the path metrics at the i-th level.

Therefore, the decoder calculates the reference path metric value $Pm_{ri}$ and removes paths whose metric values are larger than $Pm_{ri}$ in order to select the best A paths. In a real system, an integration value in Equation 1 may be tabled to thus be realized simply.

However, we may not estimate the reliability value in some cases if the above-mentioned method is applied to the SOVA. This kind of situation may occur due to the following reasons.

If the above complexity-reducing method is used, the decoder will eliminate some of the paths in order to keep only A paths out of S paths (S>A). Since some of the paths are eliminated, the decoder may confront nodes with only one incoming path rather than two, that is, the surviving and the contending paths. Accordingly, at such nodes, the surviving path will be determined automatically without comparing path metrics. We refer to these nodes as "Reliability non-definable; NR" nodes.

According to a basic principle of generating soft decision output information by the SOVA, a difference value between the surviving path and the contending path in an arbitrary node is defined as the soft decision output (or reliability value). When the contending path does not exist, it is impossible to define the soft decision output value.

In order to solve the above problem, we define the reliability at the NR nodes as the metric difference between the automatically determined surviving path and the reference path metric, $Pm_r$.

FIG. 1 shows an example of a trellis diagram for a general (n, k) BCH code. As shown in the trellis diagram for a (7, 4) BCH code, the number of states in the trellis continuously increases from 0 to an (n−k−1)-th point of time. The number of states is sustained to be $2^{n-k}$ from an (n-k-1)-th point of time to a (k-1)-th point of time. The number of states is continuously reduced from a (k-1)-th point of time to the (n-1)-th point of time.

When the systematic block code is assumed, in the trellis, a part from 0 to a (k-1)-th point of time corresponds to an information-word. A part from a k-th point of time to an (n-1)-th point of time corresponds to a parity-word.

In a parallel-concatenated block turbo code, it is not necessary to use reliability for parity-words. However, in a serially concatenated block turbo code using the product code, because the reliability value for parity-word parts also plays an important role, the reliability value must be calculated and used as an input for the next decoding.

When the complexity-reducing technique is applied in the parity-word part (the tail part) of the trellis, it may not be necessary to remove some paths because the number of paths is gradually reduced. Nevertheless, we may confront the NR codes due to the influences of the paths removed in the information-word part (the middle part) of the trellis.

In general, when the complexity-reducing technique is applied, the number of paths at an arbitrary point of time may be smaller than the number of paths to be sustained, that is A. Accordingly, a case where such path-removing work is not necessary may occur. Such a case mainly occurs in the parity-word part of the trellis.

In the above case of the tail part of the trellis, the value of the reference path metric is assigned as the smallest value among all of the existing paths in order to sustain all of the paths. Accordingly, the reliability value for the NR node in this case will be assigned as too optimistic a value because the reliability value is the difference between the path metric of the automatically generated surviving path and the reference path metric.

FIG. 2 shows distribution plots of the average of the reliability values in the information-word part and the parity-word part of the trellis with the number of iterations when the complexity-reducing technique is applied. The block turbo code using the product code of the (31, 20) expurgated BCH code is applied, and the maximum numbers of paths sustained by a decoder, A, are 256, 1024, and 2048.

FIG. 2A shows the distribution plot of the average of the reliability values in the information-word and parity-word parts when A is 256. FIG. 2B shows the distribution plot of the average of the reliability values in the information-word and parity-word parts when A is 1024. FIG. 2C shows the distribution plot of the average of the reliability values in the information-word and parity-word parts when A is 2048, which is the total number of existing paths, S.

Referring to FIG. 2, E(R) denotes the average of the reliability value, "Middle" denotes the information-word part of the trellis, and "Tail" denotes the parity-word part of the trellis. The total number of existing paths, S, is 2048.

When the total number of paths sustained by the decoder, A, is 2048, which is the same as the number of existing paths, S, as shown in FIG. 2C, the average of the reliability values of the information-word part of the trellis is almost equal to the average of the reliability value of the parity-word part of the trellis.

If A becomes far less than S, the difference between the average of the reliability value of the information-word part and the average of the reliability value of the parity-word part becomes larger. This implies that, in this case, the reliability value is evaluated to be far more optimistic in the parity-word part, that is, that the reliability values are assigned to be too large.

Therefore, the above decoding method efficiently operates for a parallel concatenated block turbo code where two block codes are concatenated to each other in parallel. When the two block codes are serially concatenated to each other, the complexity reduction technique with a certain amount of complexity reduction may cause serious performance degradation.

SUMMARY OF THE INVENTION

It is an object of the present invention to provide a method for iteratively decoding a block turbo code and a recording medium for storing an iterative decoding program of a block turbo code, which are capable of reducing complexity, efficiently calculating a soft decision output value, and obtaining desired complexity by a simple method, without serious performance degradation when iterative decoding is performed using a soft decision output Viterbi decoding method for a product code of a block code.

In order to achieve the above object, there is provided a method for iteratively decoding a block turbo code, including (a) receiving a signal frame formed of a product code obtained by serially concatenating block codes transmitted from a transmission port; (b) forming a reliability array for signal demodulation and initializing extrinsic reliability information when a signal frame is received in the step (a); (c) performing a complexity-reduced soft decision output Viterbi decoding algorithm on all of the codewords existing on a current axis after performing the step (b) and calculating extrinsic reliability to be used in a next axis using soft decision output information output as a result of the decoding performed in step (c); (d) checking whether an iterative decoding completion condition is satisfied when the step (c) is completed, and outputting a decoded value and terminating an iterative decoding process when the iterative decoding completion condition is satisfied; and (e) normalizing reliability information calculated in the step (c) when an iterative decoding completion condition is not satisfied in the step (d), performing reliability equalization work, and repeating the decoding process for a next axis. A specific value such as the threshold value of a soft decision output value or a number of iterations can be used as the iterative decoding completion condition in the step (d).

The step (c) includes (c1) calculating a ratio of the number of paths extended at a current point of time to the maximum number of paths and estimating the reference path metric using statistics of a path metric, when the total number of existing paths S of the trellis at the current point of time is larger than the maximum number of paths to be sustained, A; (c2) assigning the reference path metric as a minimum path metric value at the current point of time when the total number of paths of the trellis at the current point of time for the block code is smaller than the maximum number of paths to be sustained (S<A); (c3) selecting paths having better path metrics than the reference path metric calculated in the step (c1) or (c2); (c4) assigning the reliability at a node at the current point of time as a difference value between the reference path metric calculated in step (c1) and the path metric of the automatically generated surviving path if reliability cannot be defined at the node; and (c5) comparing reliability at previous points of time with reliability assigned at the current point of time for the path assigned in the step (c4), and assigning the reliability at the previous points of time as the minimum value amongst them.

The step (c1) comprises the step of obtaining the reference path metric by applying the statistics of the path metric to the following Equation:

$$\frac{A}{S_i} = \begin{cases} \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i > 0.5 \\ 1 - \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i < 0.5 \end{cases}$$

wherein A denotes the number of paths to be sustained, $S_i$ denotes the total number of existing paths at the i-th time point, $m_{Pmi}$ is the mean of the path metric at the i-th time point, $\sigma_{pmi}$ indicates the standard deviation of the path metric in the i-th level, and $Pm_{ri}$ is a reference path metric in the i-th level.

The path metric statistics in the step (c1) are used when a certain number of paths-is selected or detected on the basis of the path metric values.

The step (e) comprises (e1) obtaining the average and the variance of the absolute value of the extrinsic reliability information and calculating a normalization constant C using the average and the variance, (e2) fixing a normalization constant value to a fixed value when the normalization constant value calculated in the step (e1) deviates from a reference range, and (e3) normalizing the extrinsic reliability information by multiplying the normalization constant C calculated in the steps (e1) and (e2) by the extrinsic reliability information.

The reference range in the step (e2) is $0 \leq C \leq 0.5$, and the fixed value in the step (e2) is 0.5.

The normalization constant in the step (e1) is obtained by the following Equation:

$$C = 2m|L(u_c)'|/\sigma|L(u_c)'|$$

wherein C denotes a normalization constant, $m|L(u_c)'|$ denotes the average of the absolute value of extrinsic reliability information, and $\sigma|L(u_c)'|$ is the variance of the absolute value of extrinsic reliability information.

The step (e) comprises (e1) calculating the average avg1 of the extrinsic reliability value of an information-word part calculated in each codeword and the average avg2 of the extrinsic reliability value of a parity-word part calculated in each codeword, (e2) calculating a ratio (avg1/avg2) of the average of the reliability value of the parity-word part calculated in the step (e1) to the average of the reliability value of the information-word part calculated in the step (e2), and (e3) comparing the ratio of the average of the reliability value calculated in the step (e2) with a threshold value and performing an equalization process if it is determined to be required.

The step (e3) comprises (i) performing a reliability equalization by multiplying the ratio (avg1/avg2) of the average of the reliability value by the extrinsic reliability value corresponding to the parity-word part if the ratio (avg1/avg2) is smaller than the threshold value, and (ii) performing extrinsic reliability normalization and reliability equalization processes of the next row or column when the ratio (avg1/avg2) is larger than the threshold value.

The threshold value of the step (e3) is 1.

A recording medium for storing an iterative decoding program of a block turbo code is provided for storing a program executable by a computer so that an iterative decoding process is performed using a complexity-reduced SOVA for a product code of a block code, the recording medium comprising a first process for receiving a signal frame formed of a product code of a block code transmitted by a transmission port; a second process for forming a reliability array for signal demodulation and initializing extrinsic reliability information when the signal frame is received by the first process; a third process for performing a complexity-reduced soft decision output Viterbi decoding algorithm for all of the codewords existing in the current axis after performing the second process and calculating extrinsic reliability to be used in the next axis using the soft decision output information calculated as a result of the decoding; a fourth process for checking whether an iterative decoding completion condition is satisfied after performing the third process and outputting a decoded value and completing an iterative decoding process when the iterative decoding completion condition is satisfied; and a fifth process for normalizing calculated reliability information when the iterative decoding completion condition is not satisfied in the fourth process, performing a reliability equalization work, and repeating the decoding process for the next axis.

BRIEF DESCRIPTION OF THE DRAWINGS

The accompanying drawings, which are incorporated in and constitute a part of the specification, illustrate an embodiment of the invention, and, together with the description, serve to explain the principles of the invention:

FIGS. 2A through 2C show distribution plots of the average values of reliability values in the information-word part and the parity-word part of the trellis by applying a complexity-reducing technique in a block turbo code using a product code of a (31, 20) expurgated BCH code with a given maximum number of paths sustained;

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive. A content that may be applied to another embodiment among contents mentioned in an embodiment may be applied to the embodiment without being mentioned in the embodiment.

Figure 1:
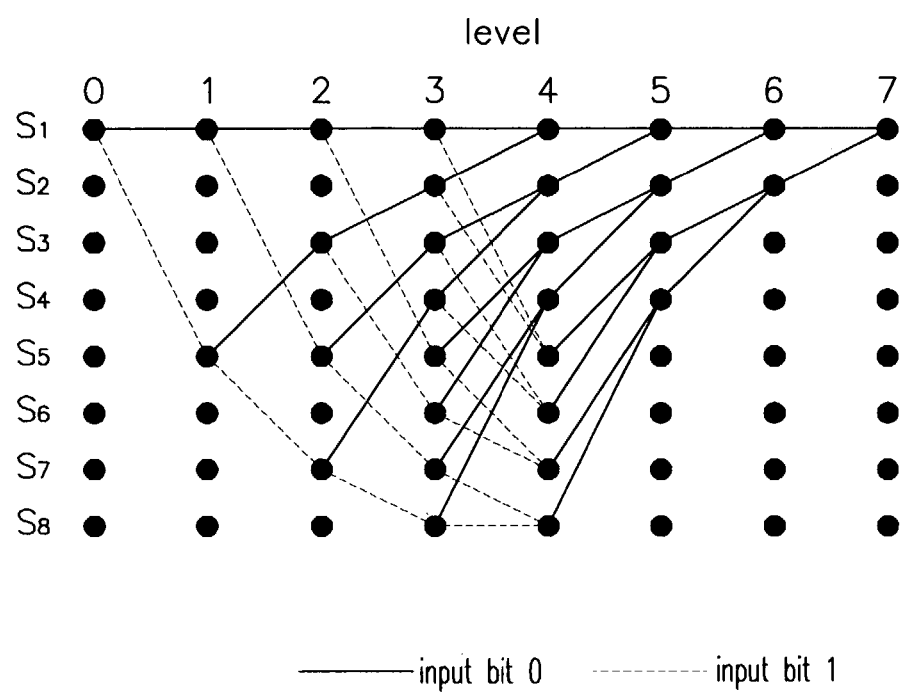
FIG. 1 shows an example of a trellis diagram for a common (n, k) BCH code.
Figure 2A:
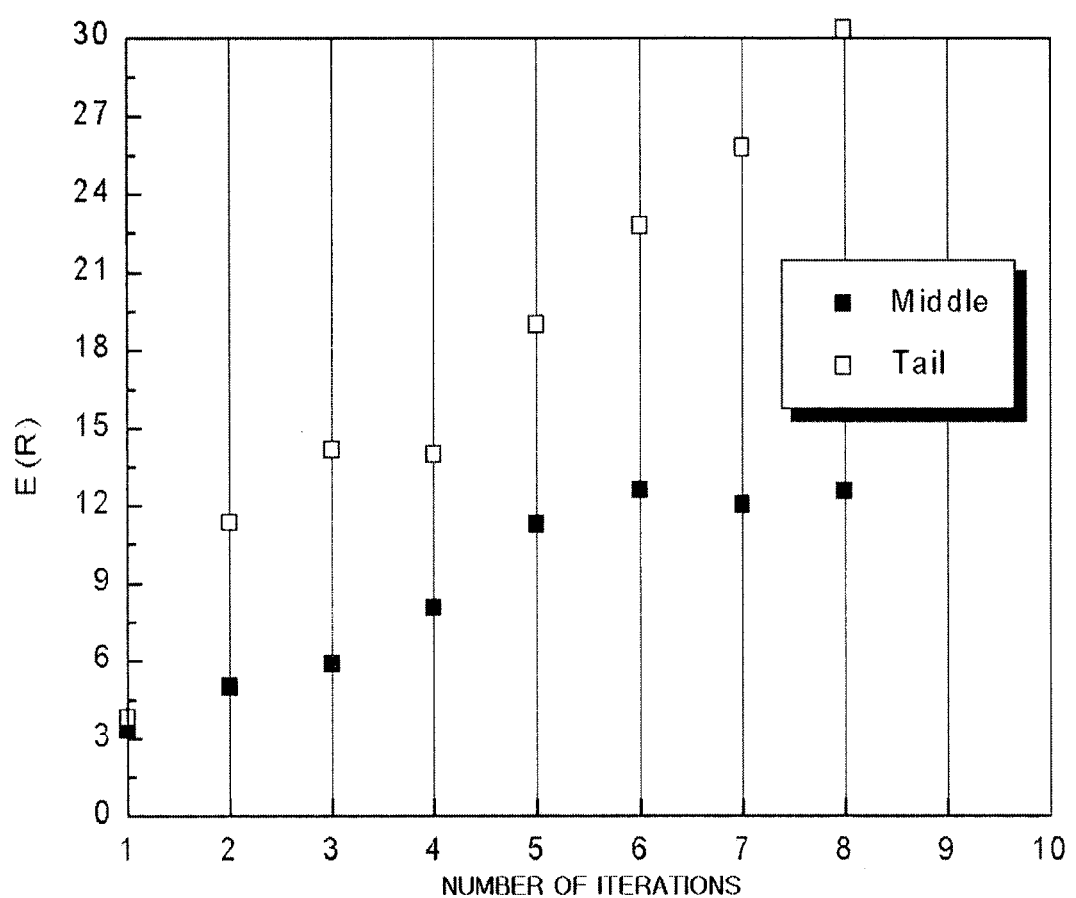
Figure 2C:
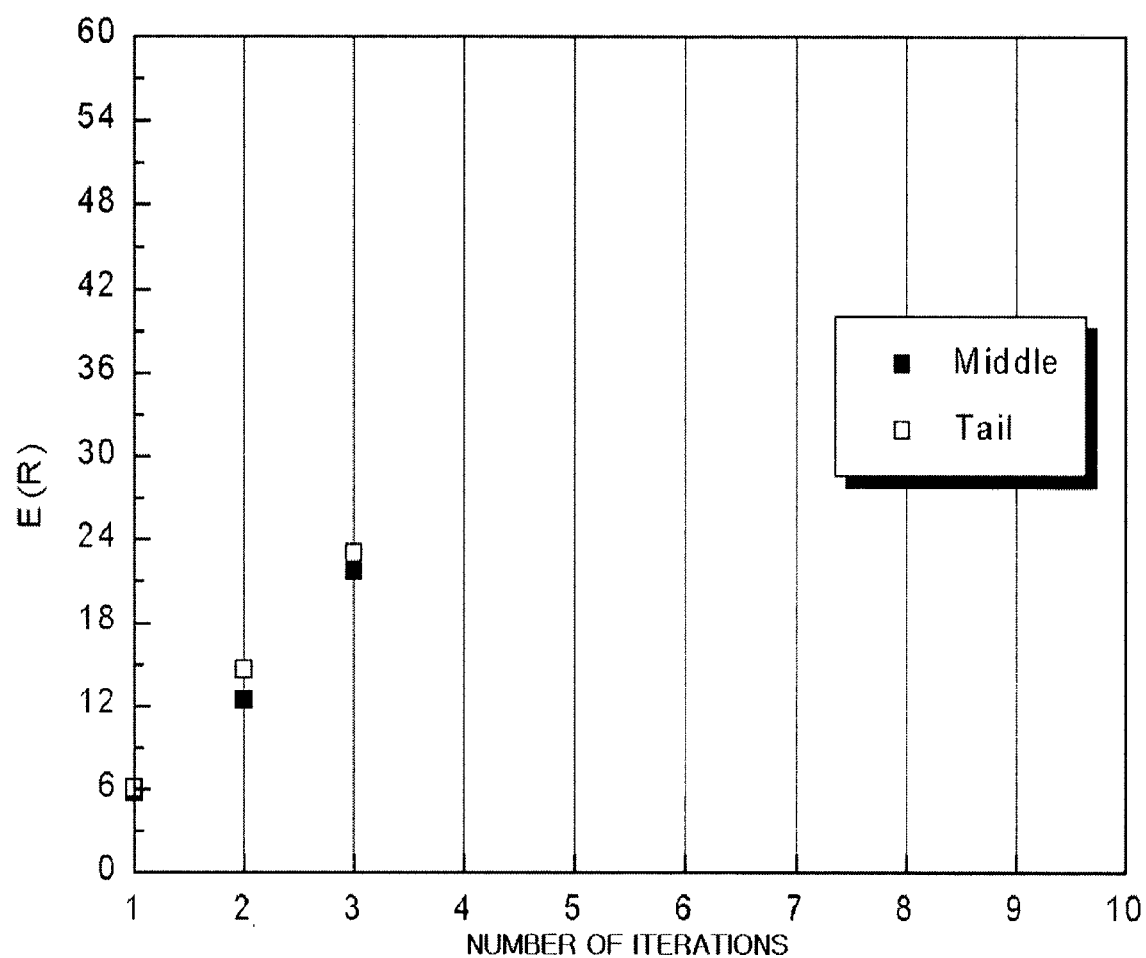
Figure 3:
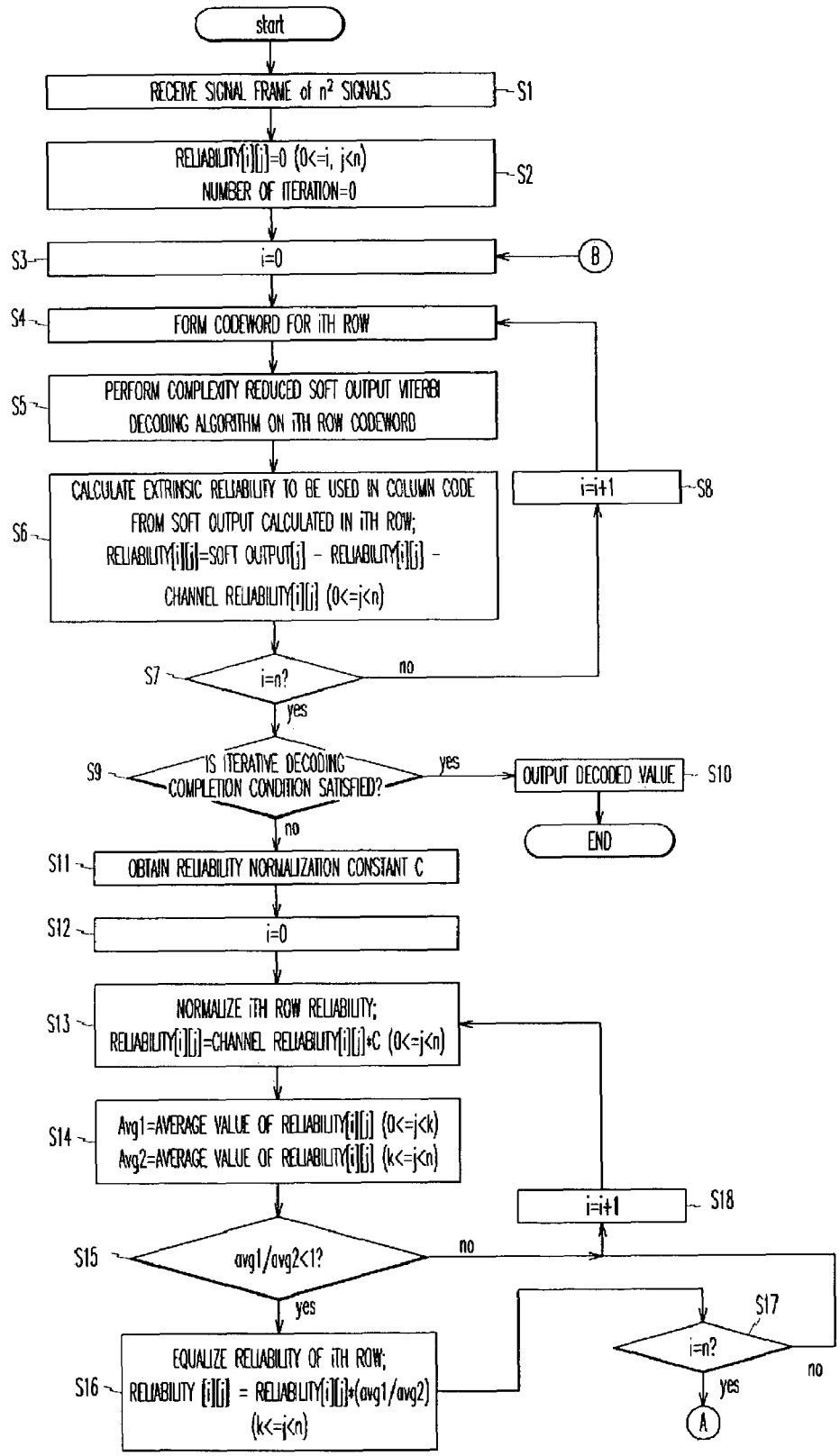
FIGS. 3 and 4 are flow charts showing an iterative decoding method of a block turbo code according to embodiments of the present invention.
Figure 4:
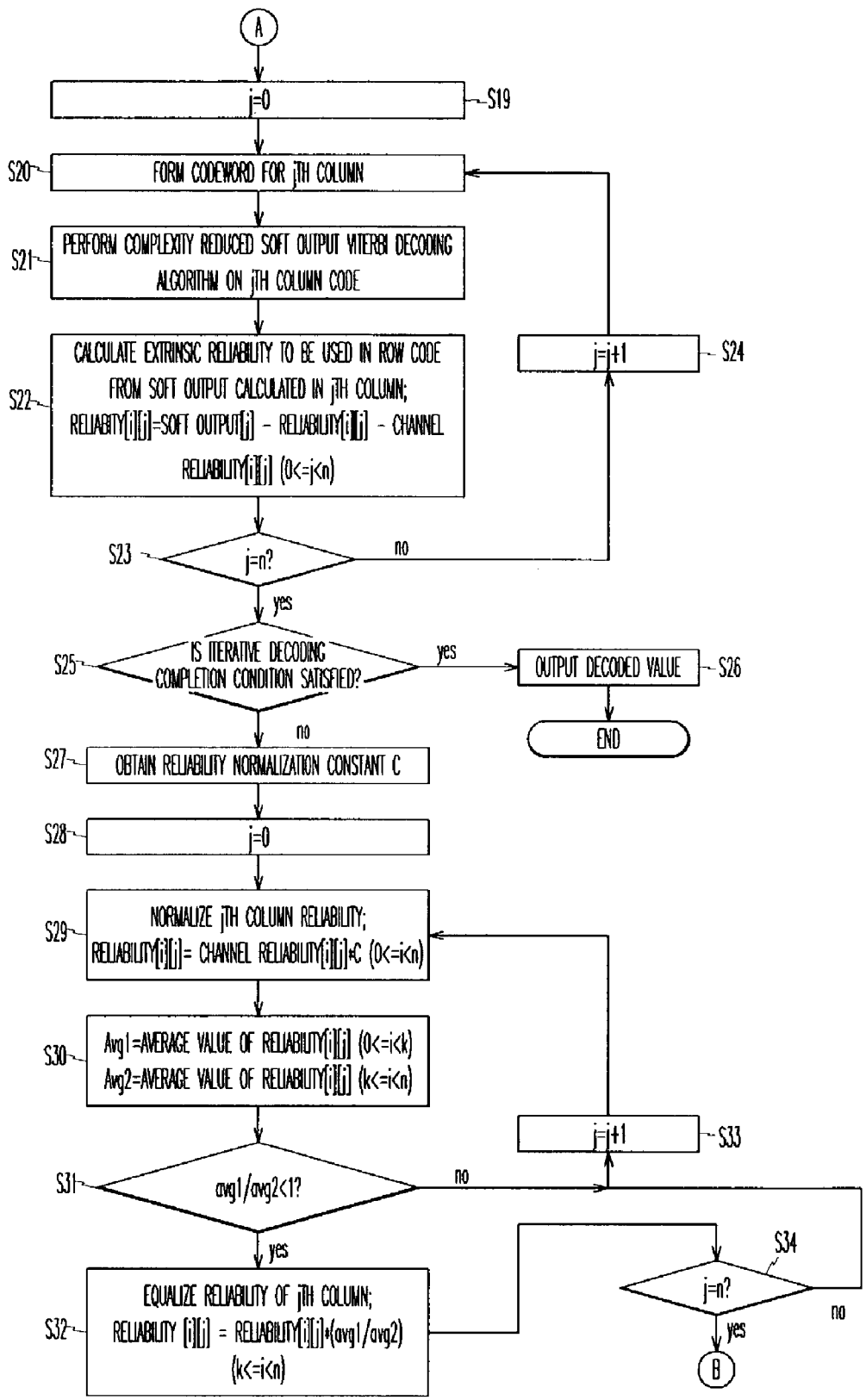

FIGS. 3 and 4 are flow charts showing an iterative decoding method of a block turbo code according to embodiments according to the present invention. A two-dimensional product code is described in the present invention. The same processes may be performed for each axis of any dimensional product code.

As shown in FIG. 3, when a transmission port transmits a signal frame of $n^2$ signals formed of a product code obtained by serially concatenating (n, k) systematic block codes to each other, a reception port receives the signal frame of $n^2$ signals (S1). $n^2$ reliability arrays for the signal frame are formed, and the values of the $n^2$ reliability arrays are initialized to 0. In other words, extrinsic reliability information is initialized to 0 (S2). That is, reliability [i][j]=0 ($0 \leq i, j<n$), and the number of iterations is 0.

After decoding is performed on n codewords that form n rows in a row direction, decoding is performed on the n codewords that form n columns in a column direction. In an order of performing decoding, the row direction and the column direction may change.

When decoding is performed on n codewords that form n rows, an i value is initialized to 0 (S3) and a codeword is formed for the row code corresponding to an i-th row (S4). A complexity-reduced soft decision output Viterbi decoding algorithm is performed on the code word of the i-th row (S5).

A complexity-reduced soft output Viterbi algorithm (SOVA) proceeds according to the following method.

When the total number of existing paths S of the trellis at the current point of time is larger than the maximum number of paths A to be sustained, calculating a ratio of extended paths at the current point of time to the maximum number of paths to be sustained and estimating a reference path metric using the statistics of the path metric are performed.

When the total number of paths at the current point of time is smaller than the maximum number of paths to be sustained, the reference path metric is assigned as the minimum path metric value at the current point of time. At this time, paths having better path metrics than the reference path metric are selected.

Also, reliability at a node at the current point of time is assigned as a difference value between the reference path metric and the path metric of the automatically generated surviving path when reliability cannot be defined at the node. For a thus-assigned path, the reliability at previous points of time is compared with the reliability assigned at the current point of time and is assigned as the minimum value amongst them.

The reference path metric is calculated by applying the statistics of the path metric to the following Equation 2.

$$\frac{A}{S_i} = \begin{cases} \int_{Pm_{ri}}^{\infty} \frac{1}{\sqrt{2\pi} \sigma_{Pmi}} \exp\left(-\frac{(x-m_{Pmi})^2}{2\sigma_{Pmi}^2}\right) dx \\ \quad \text{if } A/S_i > 0.5 \\ 1 - \int_{Pm_{ri}}^{\infty} \frac{1}{\sqrt{2\pi} \sigma_{Pmi}} \exp\left(-\frac{(x-m_{Pmi})^2}{2\sigma_{Pmi}^2}\right) dx \\ \quad \text{if } A/S_i < 0.5 \end{cases}$$ [EQUATION 2]

wherein A denotes the number of paths to be sustained, $S_i$ denotes the total number of existing paths at the i-th time point, $m_{Pm_i}$ is the mean of the path metric at the i-th time point, $\sigma_{pmi}$ is the standard deviation of the path metric at the i-th time point, and $Pm_{ri}$ is a reference path metric at the i-th time point.

The path metric statistics are used when a certain number of paths is selected or detected on the basis of the path metric value.

Extrinsic reliability to be used in decoding in the column direction is calculated from the soft decision output value calculated as a result of performing the complexity-reduced soft decision output Viterbi decoding algorithm (S6).

The extrinsic reliability to be used in the decoding in the column direction may be obtained by subtracting the original reliability value and the reliability value received from a channel from the soft decision output value. That is, reliability[i][j]=soft output[j]−reliability[i][j]−channel reliability[i][j] ($0 \leq j<n$).

It is checked whether i corresponds to n (S7). When i is not equal to n, the complexity-reduced SOVA and extrinsic reliability calculation are performed for the i-th row while i approaches n by increasing the i value by one (S8). When i is equal to n and decoding of the n rows is completed (S7), it is checked whether an iterative decoding completion condition is satisfied (S9).

The iterative decoding completion condition may be the threshold value of the soft decision output value or the number of iterations.

When the iterative decoding completion condition is satisfied in the step S9, the decoded value is output and the iterative decoding process is completed (S10). When the iterative decoding completion condition is not satisfied, a reliability normalization constant C as shown in the following Equation 3 is calculated using the average and the variance of the calculated $n^2$ reliability values (S11).

$$C = 2m|L(u_c)'|/\sigma|L(u_c)'|$$ [EQUATION 3]

wherein C denotes a normalization constant, $m|L(u_c)'|$ denotes the average of the absolute value of extrinsic reliability information, and $\sigma|L(u_c)'|$ is the variance of the absolute value of extrinsic reliability information.

After calculating the normalization constant C, i is initialized to 0 (S12) and reliability of the i-th row is normalized by multiplying the normalization constant by the corresponding reliabilities (reliability[i][j]=reliability[i][j]*C ($0 \leq j<n$)) (S13).

When the normalization constant value is larger than 0.5 or smaller than 0, the normalization constant value is fixed as 0.5.

The average avg1 of the reliability values (the reliability values from 0 to a (k−1)-th point of time) corresponding to the information-word and the average avg2 of the extrinsic reliability values (the extrinsic reliability values from the (k−1)-th point of time to a (n−1)-th point of time) corresponding to the parity-word are calculated in the corresponding rows (S14).

It is checked whether a ratio of the average of the reliability value of the parity-word to the average of the reliability value of the information-word (avg1/avg2) is smaller than 1 (S15). When the ratio of the average of the reliability value of the parity-word to the average of the reliability value of the information-word is smaller than 1, reliability equalization work is performed by multiplying avg1/avg2 by the reliability value of the parity-word part, that is, performing reliability[i][j]=reliability[i][j]*(avg1/avg2) ($k \leq j<n$) (S16).

When the decoding work is not completed for n rows or the ratio of the average of the reliability value of the parity-word to that of the reliability value of the information-word avg1/avg2 is larger than 1, reliability normalization and reliability equalization work are performed on the next row while the i value approaches n by increasing the i value by 1 (S17 and S18).

When the iterative decoding completion condition is not satisfied even though the decoding work is completed for the n rows, decoding is performed for n codewords that form n columns as shown in FIG. 4.

The process with n codewords in the column direction is iterated in the same process as with the codewords in the row direction. A j value is initialized to 0 (S19) and a codeword is formed for a j-th column (S20).

The complexity-reduced soft decision output Viterbi decoding algorithm is performed for a codeword corresponding to a j-th column (S21). Extrinsic reliability to be used in row direction decoding of the next step is calculated from the soft decision output value calculated as a result of decoding of the j-th column (S22).

The extrinsic reliability to be used in row direction decoding of the next step is calculated by subtracting the original reliability value and the reliability value received from the channel from the soft decision output value as mentioned above.

The above complexity-reduced soft decision output Viterbi decoding algorithm and the extrinsic reliability calculation processes are performed for for the j-th column while j approaches n by increasing the j value by one (S23 and S24).

When the above process is completed for the n columns (S23), it is checked whether the iterative decoding completion condition is satisfied and the decoded value is output, and the process is completed when the iterative decoding completion condition is satisfied (S25 and S26).

When the iterative decoding completion condition is not satisfied, the reliability normalization constant is obtained using the average and the variance of $n^2$ reliability values (S27). j is initialized to 0 (S28). The reliability of the j-th column is normalized by multiplying the normalization constant by the corresponding reliability (S29). The averages avg1 and avg2 of the reliability values corresponding to the information-word and the parity-word are obtained in each column (S30).

When avg1/avg2 is smaller than 1, the reliability equalization work is performed by multiplying avg1/avg2 by the reliability value corresponding to the parity-word part (S31 and S32). When avg1/avg2 is larger than 1, the same reliability normalization and equalization work are performed in the next column while the j value approaches n by increasing the j value by 1 (S33).

When the decoding is completed for the n codewords that form the n columns, the process returns to S3 and the above processes are iteratively performed for the codewords that form the n rows (S34).

Therefore, in the method according to the present invention, it is possible to equalize the averages of the reliability values of the parity-word part and the information-word part by obtaining the average avg1 of the reliability values of the information part of the trellis and the average avg2 of the reliability values of the parity-word part of the trellis and multiplying the ratio avg1/avg2 by the reliability of the parity-word part of the trellis.

When the reliability equalization technique is applied, it is possible to compensate the too optimistically estimated reliability value in the parity-word part. Accordingly, it is possible to achieve efficient complexity reduction without serious performance degradation.

Figure 5:
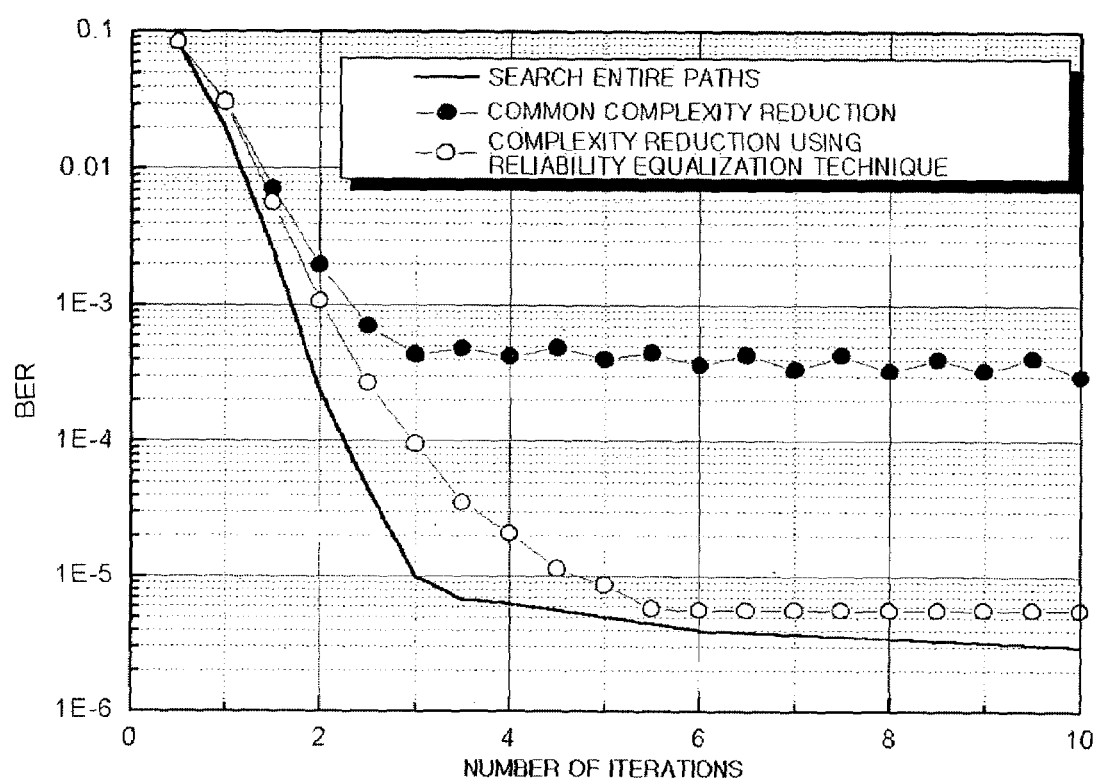
FIG. 5 shows a bit error rate (BER) performance plot according to the number of iterations when a bit energy to noise spectral density ratio ($E_b/N_o$) is 2.25 dB in a Gaussian channel during iterative decoding by applying a complexity-reducing technique for a two dimensional product code using the (31, 20) expurgated BCH code according to an embodiment of the present invention.

FIG. 5 shows a bit error rate (BER) performance according to the number of iterations when the bit energy to noise spectral density ratio is 2.25 dB in a Gaussian channel when iterative decoding is performed by using a complexity-reducing technique for a two dimensional product code using the (31, 20) expurgated BCH code according to an embodiment of the present invention.

As shown in FIG. 5, the complexity is largely reduced by selecting only 256 paths out of the 2048 paths, which corresponds to about 90% complexity reduction. If the reliability equalization technique is not used for the complexity reducing method, the performance degradation is severe compared with a full search method. If the reliability equalization technique is used, the performance of the complexity reduced method approximates that of the full search method.

While this invention has been particularly shown and described with reference to preferred embodiments thereof, it will be understood by those skilled in the art that various changes in form and details may be made therein without departing from the spirit and scope of the invention as defined by the appended claims.

In the method for iteratively decoding the block turbo code and the recording medium for storing the iterative decoding program of the block turbo code according to the present invention, it is possible to effectively realize the complexity-reduced soft decision output Viterbi decoding method using the statistics of the path metric for the product code obtained by serially concatenating the systematic block codes to each other.

Also, in the method for iteratively decoding the block turbo code and the recording medium for storing the iterative decoding program of the block turbo code according to the present invention, when iterative decoding with the product code is performed, there is little performance degradation compared with the full search method. Accordingly, it is possible to achieve almost the same performance with much less hardware complexity.

What is claimed is:

1. A method for iteratively decoding a block turbo code, comprising:

(a) receiving a signal frame formed of a product code, said product code being obtained by serially concatenating block codes transmitted from a transmission port;

(b) forming a reliability array for use as an input for signal demodulation and initializing extrinsic reliability information of the reliability array;

(c) performing a complexity-reduced soft decision output Viterbi decoding algorithm on all codewords existing on a current axis of the signal frame, and calculating extrinsic reliability information to be used in a next axis using soft decision output information output as a result of performing the complexity-reduced soft decision output Viterbi decoding;

(d) checking whether an iterative decoding completion condition is satisfied when the step (c) is completed, and outputting a decoded value to terminate the iterative decoding process when the iterative decoding completion condition is satisfied; and (e) normalizing the extrinsic reliability information calculated in the step (c) when the iterative decoding completion condition is not satisfied, performing reliability equalization work, and repeating the complexity-reduced soft decision output Viterbi decoding process for a next axis, wherein the step (c) comprises:

(c1) calculating a ratio of a number of paths extended at a current point of time to a maximum number of paths and estimating a reference path metric using statistics of a path metric, when a total number of existing paths S of a trellis at the current point of time is larger than a maximum number of paths to be sustained, A;

(c2) assigning the reference path metric as a minimum path metric value at a current point of time, when the total number of existing paths of the trellis at the current point of time for the block code is smaller than the maximum number of paths to be sustained (S<A);

(c3) selecting a path having a better path metric than the reference path metric calculated in the step (c1);

(c4) assigning a reliability at a node at the current point of time as a difference value between the reference path metric calculated in step (c1) and the path metric of an automatically generated surviving path if reliability cannot be defined at the node; and (c5) comparing reliability at previous points of time with reliability assigned at the current point of time for the path assigned in the step (c4), and assigning the reliability at the previous points of time as a minimum value amongst them.

2. The method of claim 1, wherein the step (c1) comprises the step of obtaining the reference path metric by applying statistics of the reference path metric to the following Equation:

$$\frac{A}{S_i} = \begin{cases} \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i > 0.5 \\ 1 - \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i < 0.5 \end{cases}$$

wherein A denotes the number of paths to be sustained, $S_1$ denotes the total number of existing paths at the i-th time point, $m_{Pmi}$ is the mean of the path metric at the i-th time point, $\sigma_{pmi}$ is the standard deviation of the path metric in the i-th level, and $Pm_{ri}$ is a reference path metric in the Math level.

3. The method of claim 1, wherein the path metric statistics in the step (c1) are used when a certain number of paths is selected or detected on the basis of the path metric values.

4. A method for iteratively decoding a block turbo code, comprising:

(a) receiving a signal frame formed of a product code, said product code being obtained by serially concatenating block codes transmitted from a transmission port;

(b) forming a reliability array for use as an input for signal demodulation and initializing extrinsic reliability information of the reliability array;

(c) performing a complexity-reduced soft decision output Viterbi decoding algorithm on all codewords existing on a current axis of the signal frame, and calculating extrinsic reliability information to be used in a next axis using soft decision output information output as a result of performing the complexity-reduced soft decision output Viterbi decoding;

(d) checking whether an iterative decoding completion condition is satisfied when the step (c) is completed, and outputting a decoded value to terminate the iterative decoding process when the iterative decoding completion condition is satisfied; and (e) normalizing the extrinsic reliability information calculated in the step (c) when the iterative decoding completion condition is not satisfied, performing reliability equalization work, and repeating the complexity-reduced soft decision output Viterbi decoding process for a next axis, wherein the equalization of reliability in the step (e) comprises:

(e1) calculating an average avg1 of the extrinsic reliability value of an information-word part calculated in each codeword, and an average avg2 of the extrinsic reliability value of a parity-word part calculated in each codeword;

(e2) calculating a ratio (avg1/avg2) of an average of the reliability value of the parity-word part to the average of the reliability value of the information-word part; and (e3) comparing the ratio of the average of the reliability value with a threshold value, and performing an equalization process if it is determined to be needed.

5. The method of claim 4, wherein the step (e3) comprises:

(i) performing reliability equalization by multiplying the ratio (avg1/avg2) of the average of the reliability value by the extrinsic reliability value corresponding to the parity-word part if the ratio (avg1/avg2) is smaller than the threshold value; and (ii) performing extrinsic reliability normalization and reliability equalization processes of the next row or column when the ratio (avg1/avg2) is larger than the threshold value.

6. The method of claim 4, wherein the threshold value of the step (e3) is 1.

7. A recording medium for storing an iterative decoding program of a block turbo code for storing a program executable by a computer so that an iterative decoding process is performed using a complexity-reduced SOVA for a product code of a block code, the recording medium comprising:

(a) program means for receiving a signal frame formed of a product code, said product code being obtained by serially concatenating block codes transmitted from a transmission port;

(b) program means for forming a reliability array for use as an input for signal demodulation and initializing extrinsic reliability information of the reliability array;

(c) program means for performing a complexity-reduced soft decision output Viterbi decoding algorithm on all codewords existing on a current axis of the signal frame, and calculating extrinsic reliability information to be used in a next axis using soft decision output information calculated as a result of the complexity-reduced soft decision output Viterbi decoding;

(d) program means for checking whether an iterative decoding completion condition is satisfied after performing the step (c), and outputting a decoded value to complete the iterative decoding process when the iterative decoding completion condition is satisfied; and (e) program means for normalizing the calculated extrinsic reliability information when the iterative decoding completion condition is not satisfied in (d), performing reliability equalization work, and repeating the complexity-reduced soft decision output Viterbi decoding process for a next axis, wherein the step (c) comprises:

(c1) program means for calculating a ratio of a number of paths extended at a current point of time to a maximum number of paths and estimating a reference path metric using statistics of a path metric, when a total number of existing paths S of a trellis at the current point of time is larger than a maximum number of paths to be sustained, A;

(c2) program means for assigning the reference path metric as a minimum path metric value at a current point of time, when the total number of existing paths of the trellis at the current point of time for the block code is smaller than the maximum number of paths to be sustained (S<A);

(c3) program means for selecting a path having a better path metric than the reference path metric calculated in the step (c1);

(c4) program means for assigning a reliability at a node at the current point of time as a difference value between the reference path metric calculated in step (c1) and the path metric of an automatically generated surviving path if reliability cannot be defined at the node; and (c5) program means for comparing reliability at previous points of time with reliability assigned at the current point of time for the path assigned in the step (c4), and assigning the reliability at the previous points of time as a minimum value amongst them.

8. The recording medium of claim 7, wherein the step (c1) comprises the step of obtaining the reference path metric by applying statistics of the reference path metric to the following Equation:

$$\frac{A}{S_i} = \begin{cases} \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i > 0.5 \\ 1 - \int_{Pm_{ri}}^{\infty} \frac{1}{\sqrt{2\pi}\,\sigma_{Pmi}} \exp\left(-\frac{(x-m_{Pmi})^2}{2\sigma_{Pmi}^2}\right) dx & \text{if } A/S_i > 0.5 \end{cases}$$

wherein A denotes the number of paths to be sustained, $S_i$ denotes the total number of existing paths at the i-th time point, $m_{Pmi}$ is the mean of the path metric at the i-th time point, $\sigma_{pmi}$ is the standard deviation of the path metric in the i-th level, and $Pm_{ri}$ is a reference path metric in the Math level.

9. The recording medium of claim 7, wherein the path metric statistics in the step (c1) are used when a certain number of paths is selected or detected on the basis of the path metric values.

10. A recording medium for storing an iterative decoding program of a block turbo code for storing a program executable by a computer so that an iterative decoding process is performed using a complexity-reduced SOVA for a product code of a block code, the recording medium comprising:

(a) program means for receiving a signal frame formed of a product code, said product code being obtained by serially concatenating block codes transmitted from a transmission port;

(b) program means for forming a reliability array for use as an input for signal demodulation and initializing extrinsic reliability information of the reliability array;

(c) program means for performing a complexity-reduced soft decision output Viterbi decoding algorithm on all codewords existing on a current axis of the signal frame, and calculating extrinsic reliability information to be used in a next axis using soft decision output information calculated as a result of the complexity-reduced soft decision output Viterbi decoding;

(d) program means for checking whether an iterative decoding completion condition is satisfied after performing the step (c), and outputting a decoded value to complete the iterative decoding process when the iterative decoding completion condition is satisfied; and (e) program means for normalizing the calculated extrinsic reliability information when the iterative decoding completion condition is not satisfied in (d), performing reliability equalization work, and repeating the complexity-reduced soft decision output Viterbi decoding process for a next axis, wherein the equalization of reliability in the step (e) comprises:

(e1) program means for calculating an average avg1 of the extrinsic reliability value of an information-word part calculated in each codeword, and an average avg2 of the extrinsic reliability value of a parity-word part calculated in each codeword;

(e2) program means for calculating a ratio (avg1/avg2) of an average of the reliability value of the parity-word part to the average of the reliability value of the information-word part; and (e3) program means for comparing the ratio of the average of the reliability value with a threshold value, and performing an equalization process if it is determined to be needed.

11. The recording medium of claim 10, wherein the step (e3) comprises:

(i) program means for performing reliability equalization by multiplying the ratio (avg1/avg2) of the average of the reliability value by the extrinsic reliability value corresponding to the parity-word part if the ratio (avg1/avg2) is smaller than the threshold value; and (ii) program means for performing extrinsic reliability normalization and reliability equalization processes of the next row or column when the ratio (avg1/avg2) is larger than the threshold value.

12. The recording medium of claim 10, wherein the threshold value of the step (e3) is 1.

* * * * *